US008242535B2

(12) United States Patent
Senoo

(10) Patent No.: US 8,242,535 B2
(45) Date of Patent: Aug. 14, 2012

(54) IGBT AND METHOD OF PRODUCING THE SAME

(75) Inventor: Masaru Senoo, Okazaki (JP)

(73) Assignee: Toyota Jidosha Kabushiki Kaisha, Toyota-shi (JP)

( * ) Notice: Subject to any disclaimer, the term of this patent is extended or adjusted under 35 U.S.C. 154(b) by 232 days.

(21) Appl. No.: 12/867,983

(22) PCT Filed: Feb. 17, 2009

(86) PCT No.: PCT/IB2009/000278
§ 371 (c)(1),
(2), (4) Date: Aug. 17, 2010

(87) PCT Pub. No.: WO2009/104068
PCT Pub. Date: Aug. 27, 2009

(65) Prior Publication Data
US 2011/0006338 A1    Jan. 13, 2011

(30) Foreign Application Priority Data

Feb. 19, 2008    (JP) ................................. 2008-037324

(51) Int. Cl.
*H01L 29/739* (2006.01)
(52) U.S. Cl. ................. 257/139; 257/E29.197; 438/138
(58) Field of Classification Search .......... 257/132–135, 257/138, 139, 197, 409, 490, 493, E29.197; 438/138
See application file for complete search history.

(56) References Cited

U.S. PATENT DOCUMENTS

| | | | |
|---|---|---|---|
| 5,304,821 A * | 4/1994 | Hagino | 257/133 |
| 5,493,134 A * | 2/1996 | Mehrotra et al. | 257/132 |
| 6,054,748 A | 4/2000 | Tsukuda et al. | |
| 6,521,919 B2 * | 2/2003 | Hirano et al. | 257/147 |
| 7,679,146 B2 * | 3/2010 | Tu et al. | 257/401 |
| 7,709,931 B2 * | 5/2010 | Torii | 257/586 |
| 8,008,711 B2 * | 8/2011 | Takahashi | 257/327 |
| 8,017,974 B2 * | 9/2011 | Hisamoto | 257/139 |
| 8,058,670 B2 * | 11/2011 | Hshieh | 257/136 |
| 2003/0215985 A1 | 11/2003 | Kouno et al. | |
| 2006/0273346 A1 | 12/2006 | Pfirsch | |
| 2007/0200138 A1 * | 8/2007 | Ozeki et al. | 257/139 |
| 2007/0215898 A1 * | 9/2007 | Ozeki et al. | 257/139 |

FOREIGN PATENT DOCUMENTS

| | | |
|---|---|---|
| JP | 10-321877 A | 12/1998 |
| JP | 2003-249654 A | 9/2003 |
| JP | 2005-142288 A | 6/2005 |
| JP | 2005-303218 A | 10/2005 |
| JP | 2009-105265 A | 5/2009 |

* cited by examiner

*Primary Examiner* — Nathan Ha
(74) *Attorney, Agent, or Firm* — Kenyon & Kenyon LLP

(57) ABSTRACT

A collector region is not formed in at least a portion of an ineffective region where an insulating film is formed on a front face of an IGBT. In this portion in which the collector region is not formed, a collector electrode and a buffer layer contact each other. Since the buffer layer and the collector region differ from each other in conductivity type, no electric charge is introduced from the collector electrode into the buffer layer. Thus, introduction of electric charges into a drift region at a portion in the ineffective region is suppressed, which alleviates electric field concentration in a semiconductor substrate. Further, in the IGBT, the semiconductor substrate and the collector electrode contact each other and heat transfer to the collector electrode is not hindered even in the range where the collector region is not formed. Thus, concentration of heat generation in the semiconductor substrate is alleviated.

4 Claims, 7 Drawing Sheets

IGBT AND METHOD OF PRODUCING THE SAME

This is a 371 national phase application of PCT/IB2009/000278 filed 17 Feb. 2009, claiming priority to Japanese Patent Application No. 2008-037324 filed 19 Feb. 2008, the contents of which are incorporated herein by reference.

BACKGROUND OF THE INVENTION

The invention relates generally to an insulated gate bipolar transistor (hereinafter, referred to as "IGBT"), and a method of producing the IGBT. More specifically, the invention relates to an IGBT with alleviated electric field concentration, improved latch-up tolerance, and improved heat dissipation properties, and to a method of producing the IGBT.

FIELD OF THE INVENTION

An IGBT is able to acquire the characteristic of low on-voltage through a conductivity modulation phenomenon, and is able to acquire both the characteristics of high withstand voltage and low on-voltage.

DESCRIPTION OF THE RELATED ART

FIG. 10 is a sectional view showing an IGBT 602 described in Japanese Patent Application Publication No. 2005-142288 (JP-A-2005-142288). An emitter electrode 620 is formed on a front face of a semiconductor substrate 604, and a collector electrode 642 is formed on a rear face of the semiconductor substrate 604. The IGBT 602 is a vertical IGBT. In a planar view of the semiconductor substrate 604, the IGBT 602 has an effective region 630 and an ineffective region 632. The ineffective region 632 surrounds the effective region 630, and contributes to an increase in the withstand voltage of the IGBT 602. Emitter regions 650, a body region 648, a drift region including drift regions 646 and 645, and a collector region 644 are formed in the effective region 630 of the semiconductor substrate 604. The emitter regions 650 are of n-type, are formed in a range adjacent to the front face of the semiconductor substrate 604, and are in contact with the emitter electrode 620. The collector region 644 is of p-type, is formed in a range adjacent to the rear face of the semiconductor substrate 604, and is in contact with the collector electrode 642. The drift region including the drift regions 646 and 645 is of n-type, and is in contact with the collector region 644. The drift region includes the narrowly-defined drift region 646 where the concentration of n-type dopant is low, and the buffer layer 645 where the concentration of n-type dopant is high. It is to be noted herein that the narrowly-defined drift region 646 and the buffer layer 645 are collectively referred to as the drift region. A drift region without a buffer layer may be formed. The body region 648 is of p-type, and separates the emitter regions 650 from the drift region including the drift region 646 and 645. A structure formed by laminating a gate insulating film 660 and a gate electrode 658 is arranged on the front face of the semiconductor substrate 604 in such a manner that this structure faces a portion of the body region 648, which separates the emitter region 650 from the drift region 646. The gate electrode 658 is insulated from the emitter electrode 620 by an interlayer insulating film 652. In the effective region 630, the emitter electrode 620 is in contact with the front face of the semiconductor substrate 604. Field limiting rings (hereinafter, referred to as "FLRs") 676 are formed in the semiconductor substrate 604 at a portion in the ineffective region 632. In this example, three FLRs 676 are formed. The FLRs 676 are floated, and insulated from the emitter electrode 620. In the ineffective region 632, the front face of the semiconductor substrate 604 is covered with an insulating film 664. In the ineffective region 632, the front face of the semiconductor substrate 604 is not in contact with the emitter electrode 620. The collector region 644 and the drift regions 646 and 645 are formed in both the effective region 630 and the ineffective region 632.

The IGBT 602 is used with the collector electrode 642 connected to a positive electrode of a direct-current power source and with the emitter electrode 620 grounded. In this state, when a positive voltage is applied to the gate electrode 658, the polarity of a portion of the body region 648, which faces the gate electrode 658, is reversed, which produces a channel that establishes conductivity between the emitter region 650 and the drift region 646. Then, electrons are introduced from the emitter electrode 620 into the drift region 646 through the emitter region 650 and the channel. As a result, these electrons stay in the drift region 646. Electron holes are then introduced from the collector electrode 642 into the drift region 646 through the collector region 644. An active conductivity modulation phenomenon occurs in the drift region 646, and conductivity between the emitter electrode 620 and the collector electrode 642 is established. The IGBT 602 utilizes a conductivity modulation phenomenon and hence is low in on-voltage.

In an IGBT, a latch-up phenomenon may occur, and there is a need to take measures against this phenomenon. When the IGBT is on, electron holes introduced from the collector region 644 into the drift region 646 within the ineffective region 632 move toward the emitter electrode 620 formed within the effective region 630. Thus, the electron holes tend to be concentrated in an area in the vicinity of a portion of the boundary face between the body region 648 and the drift region 646, the portion being closest to the ineffective region 632. A high electric field tends to be generated in this area in the vicinity of the aforementioned portion of the boundary face. If a high electric field is generated in the vicinity of the boundary face between the body region 648 and the drift region 646, a voltage equal to or higher than a threshold voltage of a parasitic diode formed of the p-type body region 648 and the n-type drift region 646 may be generated due to the high electric field. If this phenomenon occurs, a current continues to flow between the emitter electrode 620 and the collector electrode 642 even after the application of a positive voltage to the gate electrode 658 is suspended. That is, a latch-up phenomenon occurs.

According to Japanese Patent Application Publication No. 2005-142288 (JP-A-2005-142288), in order to avoid occurrence of a latch-up phenomenon, an insulating layer 643 is formed, instead of the collector region 644, in an outer-side range within the ineffective region 632. According to the technology described in Japanese Patent Application Publication No. 2005-142288 (JP-A-2005-142288), electron holes are prevented from being introduced from the collector electrode 642 into the drift region 646 in the outer-side range within the ineffective region 632. Thus, it is possible to alleviate electric field concentration that occurs in an area in the vicinity of a portion of the boundary faces between the body region 648 and the drift region 646, the portion being closest to the ineffective region 632. As a result, occurrence of a latch-up phenomenon is suppressed.

An IGBT generates heat during operation, and is thus required to exhibit sufficient heat dissipation properties. A collector electrode is usually used after being fixed to a substrate, and performs both the function of ensuring sufficient conductivity and the function of ensuring sufficient thermal conduction. In the IGBT 602 shown in FIG. 10, the heat generated in the semiconductor substrate 604 may be transferred to the substrate with the aid of both the collector electrode 642 at a portion in the effective region 630 and the collector electrode 642 at a portion in the ineffective region 632. However, when part of the collector region 644 is replaced with the insulating layer 643 as shown in FIG. 11 in order to suppress occurrence of a latch-up phenomenon, thermal resistance between the drift region 646 and the collector region 642 within the ineffective region 632 increases, and the performance of transferring heat to the substrate with the aid of the collector region 642 at a portion in the ineffective region 632 deteriorates. Further, when an IGBT 702 shown in FIG. 11 is on, electrons are introduced from the emitter region 650 into the drift region 646. The electrons introduced into the drift region 646 are dispersed also into the ineffective region 632. If the insulating layer 643 is formed in the ineffective region 632, the electrons that have been dispersed also into the ineffective region 632 are concentrated in the vicinity of the insulating layer 643 while flowing to the collector region 642. Due to local concentration of an electron current, heat tends to be generated locally. When part of the collector region 644 is replaced with the insulating layer 643, heat tends to be generated locally.

SUMMARY OF THE INVENTION

The invention provides an IGBT in which occurrence of a latch-up phenomenon is suppressed, heat dissipation performance does not deteriorate, and local heat generation does not occur, and a method of producing the IGBT having such characteristics.

A first aspect of the invention relates to a vertical insulated gate bipolar transistor (IGBT) that includes: a semiconductor substrate in which at least an emitter region, a body region, a drift region, and a collector region are formed; an emitter electrode that is formed on the front face of the semiconductor substrate; and a collector electrode that is formed on the rear face of the semiconductor substrate. The emitter region is of a first conductivity type, is formed in a range adjacent to the front face of the semiconductor substrate, and is in contact with the emitter electrode. The collector region is of a second conductivity type, is formed in a range adjacent to the rear face of the semiconductor substrate, and is in contact with the collector electrode. The drift region is of the first conductivity type, and is in contact with the collector region. The body region is of the second conductivity type, and separates the emitter region and the drift region from each other. The collector region is not formed in at least a portion of an ineffective region that surrounds an effective region where the front face of the semiconductor substrate and the emitter electrode are in contact with each other in a planar view of the semiconductor substrate, and the drift region and the collector electrode are in direct contact with each other in the ineffective region at the portion in which the collector region is not formed. The drift region may be formed of only a narrowly-defined drift region in which the concentration of dopant of the first conductivity type is low. Alternatively, the drift region may be formed of the narrowly-defined drift region in which the concentration of dopant of the first conductivity type is low and a buffer layer in which the concentration of dopant of the first conductivity type is high. In this case, the buffer layer is formed on the collector region side.

In the IGBT according to the first aspect of the invention, the collector region is not formed in at least a portion of the ineffective region. Therefore, the amount of carriers introduced from the collector electrode into the drift region within the ineffective region is reduced. If the collector region is of p-type, the amount of electron holes introduced from the collector electrode into the drift region within the ineffective region is reduced. Accordingly, it is possible to deal with a problem that carriers tend to be concentrated and therefore a high electric field tends to be generated in the vicinity of a portion of the boundary face between the body region and the drift region, the portion being closest to the ineffective region. Measures may be taken so that the IGBT is not latched up easily. Meanwhile, the drift region is in contact with the collector electrode within the ineffective region as well. No insulating layer that deteriorates heat transfer characteristics is interposed between the drift region and the collector electrode. It is therefore possible to maintain sufficient characteristics of heat transfer to the collector electrode. In addition, no layer that hinders a flow of carriers introduced from the emitter electrode into the drift region is interposed between the drift region and the collector electrode. It is therefore possible to prevent the carriers, introduced from the emitter electrode into the drift region, from being concentrated locally in the process of flowing toward the collector electrode. Local heat generation is suppressed as well.

The ineffective region where there is not conductivity between the emitter region and the emitter electrode includes, for example, a range in which a gate wire passes and a range in which an FLR is formed. It is preferable that the collector region not be formed in a range in which the FLR, which is not in conductivity with the emitter electrode, is formed. That is, it is preferable that the drift region and the collector electrode be in direct contact with each other in the range in which the FLR, which is not in conductivity with the emitter electrode, is formed. If introduction of carriers from the collector electrode into the drift region is suppressed within the range in which the FLR, which is not in conductivity with the emitter electrode, is formed, occurrence of electric field concentration that may cause a latch-up phenomenon is effectively suppressed.

The collector electrode may be formed uniformly, and the uniformly formed collector electrode may extend from the effective region to the ineffective region. Alternatively, the collector electrode may be formed of a portion that is in contact with the collector region and a portion that is in contact with the drift region. That is, the collector electrode may be formed of a first portion that is in contact with the collector region and a second portion that is in contact with the drift region. In this case, it is preferable that the second portion exhibit lower thermal resistance than that of the first portion. When the collector electrode is formed of a plurality of laminated layers, it is preferable that the heat resistance achieved by the entire thickness of the collector electrode is lower at the second portion than at the first portion. The second portion that is in contact with the drift region need not have high electric conductivity performance. Therefore, a material for the collector electrode at the portion that contacts the drift region may be selected based mainly on heat transfer efficiency. If the thermal resistance of the collector electrode at the portion contacts the drift region is lowered, the heat dissipation capacity of the entire IGBT is enhanced.

The semiconductor substrate may be thick at a portion in a range in which the collector region is formed, and may be thin at a portion in a range in which the collector region is not formed. The thickness of the semiconductor substrate required at the portion in the range in which no collector region is formed is smaller than the thickness of the semiconductor substrate required at the portion in the range in which the collector region is formed. Therefore, the semiconductor substrate may be made thin at the portion in the range in which no collector region is formed. If the semiconductor substrate is made thin, the heat dissipation capacity of the IGBT is enhanced.

A second aspect of the invention relates to a method of producing an IGBT that includes a semiconductor substrate having a non-uniform thickness. The method includes: 1) sticking a tape, which includes a large thickness portion that has a large thickness and a small thickness portion that has a thickness smaller than that of the large thickness portion, on the front face of the semiconductor substrate in such a manner that the large thickness portion is stuck on the front face of the semiconductor substrate at the portion in the range in which the collector region is not formed and the small thickness portion is stuck on the front face of the semiconductor substrate at the portion in the range in which the collector region is formed, 2) polishing the rear face of the semiconductor substrate with the tape stuck on the front face of the semiconductor substrate, and 3) doping the rear face of the semiconductor substrate, which has been polished, at the portion in the range in which the collector region is formed with second conductivity type dopant. According to this method, a portion of the semiconductor substrate, on which the large thickness portion of the tape is stuck and on which the collector region is not formed, is bent by a larger amount on the rear face side than a portion of the semiconductor substrate, on which the small thickness portion of the tape is stuck and on which the collector region is formed. In this state, the rear face of the semiconductor substrate is polished in such a manner that the rear face of the semiconductor substrate becomes flat. Thus, the rear face of the semiconductor substrate is polished by a larger amount at the portion on which no collector region is formed than at the portion on which the collector region is formed. When application of an external force is cancelled after the rear face of the semiconductor substrate is polished, the semiconductor substrate returns to its natural shape. As a result, it is possible to obtain a semiconductor substrate that has a flat front face, and that has a large thickness at a portion on which a collector region is formed and a small thickness at a portion on which no collector region is formed. According to this method, a semiconductor substrate that has a thick portion and a thin portion is produced in a single polishing step. Therefore, it is possible to produce an IGBT that has non-uniform thickness.

According to the aspects of the invention described above, it is possible to prevent occurrence of a latch-up phenomenon by alleviating electric field concentration in a semiconductor substrate, and to enhance the performance of heat dissipation. Thus, the electric characteristic and temperature characteristic of an IGBT are improved, which improves the quality of the IGBT.

BRIEF DESCRIPTION OF THE DRAWINGS

The foregoing and further features and advantages of the invention will become more apparent from the following description of preferred embodiments with reference to the accompanying drawings, wherein like numerals are used to represent like elements and wherein.

DETAILED DESCRIPTION OF THE PREFERRED EMBODIMENTS

Figure 1:
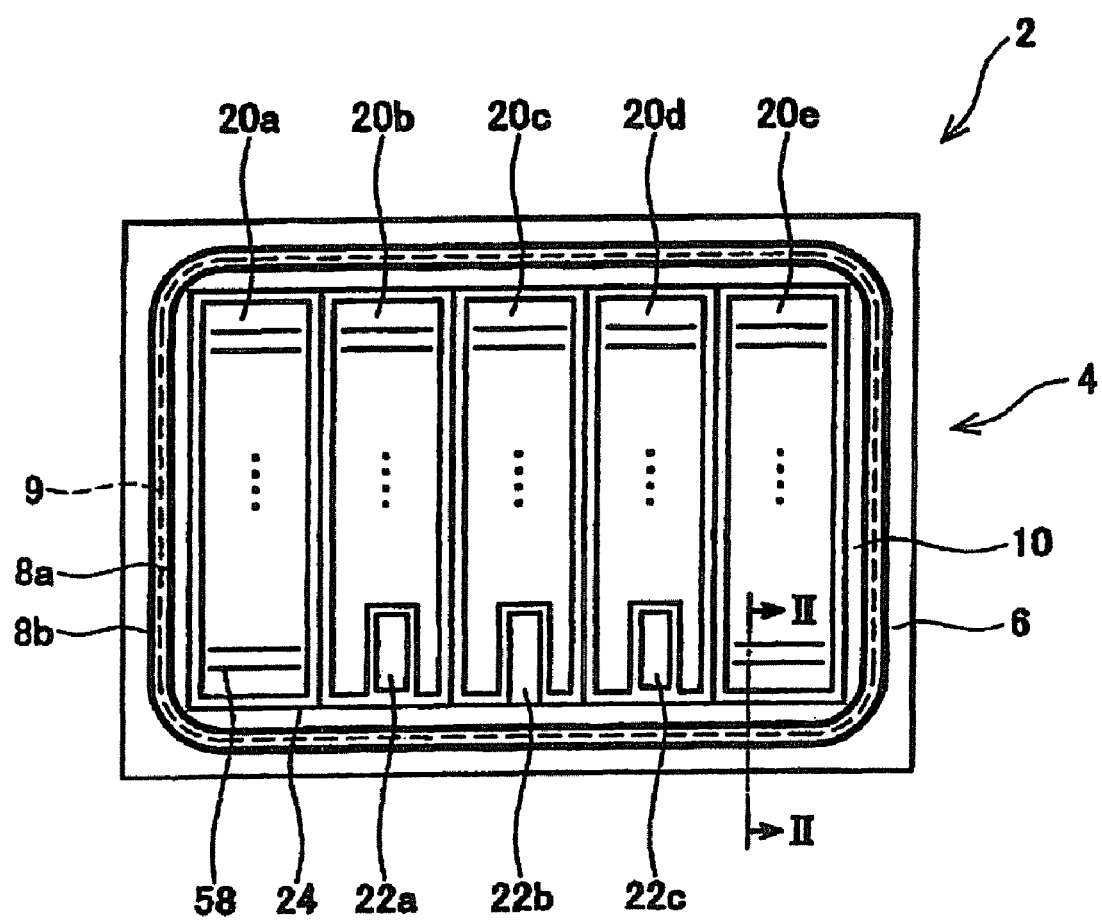
FIG. 1 is a plane view showing an IGBT 2 according to a first embodiment of the invention.

Hereafter, a first embodiment of the invention will be described. FIG. 1 shows an insulated gate bipolar transistor (hereinafter referred to as "IGBT") 2 according to the first embodiment of the invention. In the IGBT 2, a peripheral withstand voltage region 6 is formed on the inner side of the outer periphery of a semiconductor substrate 4 and extends along the outer periphery, and a cell region 10 is formed on the inner side of the peripheral withstand voltage region 6. A field limiting ring (hereinafter, referred to as "FLR") 8b and an equal potential ring (hereinafter, referred to as "EQR") 84 are formed in the peripheral withstand voltage region 6. Emitter electrodes 20a, 20b, 20c, 20d, and 20e and small signal pads 22a, 22b, and 22c are exposed at a front face of the IGBT 2 at a portion in the cell region 10. A semiconductor structure that causes the IGBT 2 to function as an IGBT is formed in the semiconductor substrate at a portion in a range where emitter electrodes 20 are formed. The small signal pads 22 are, for example, gate electrode pads. The gate electrode pads are electrically connected to a later-described trench gate electrode 58 via a wire 24. FIG. 1 also shows part of the trench gate electrode 58 that is not actually observed by the emitter electrodes 20a, 20b, 20c, 20d, and 20e. Further, an FLR 8a is formed in the cell region 10.

Figure 2:
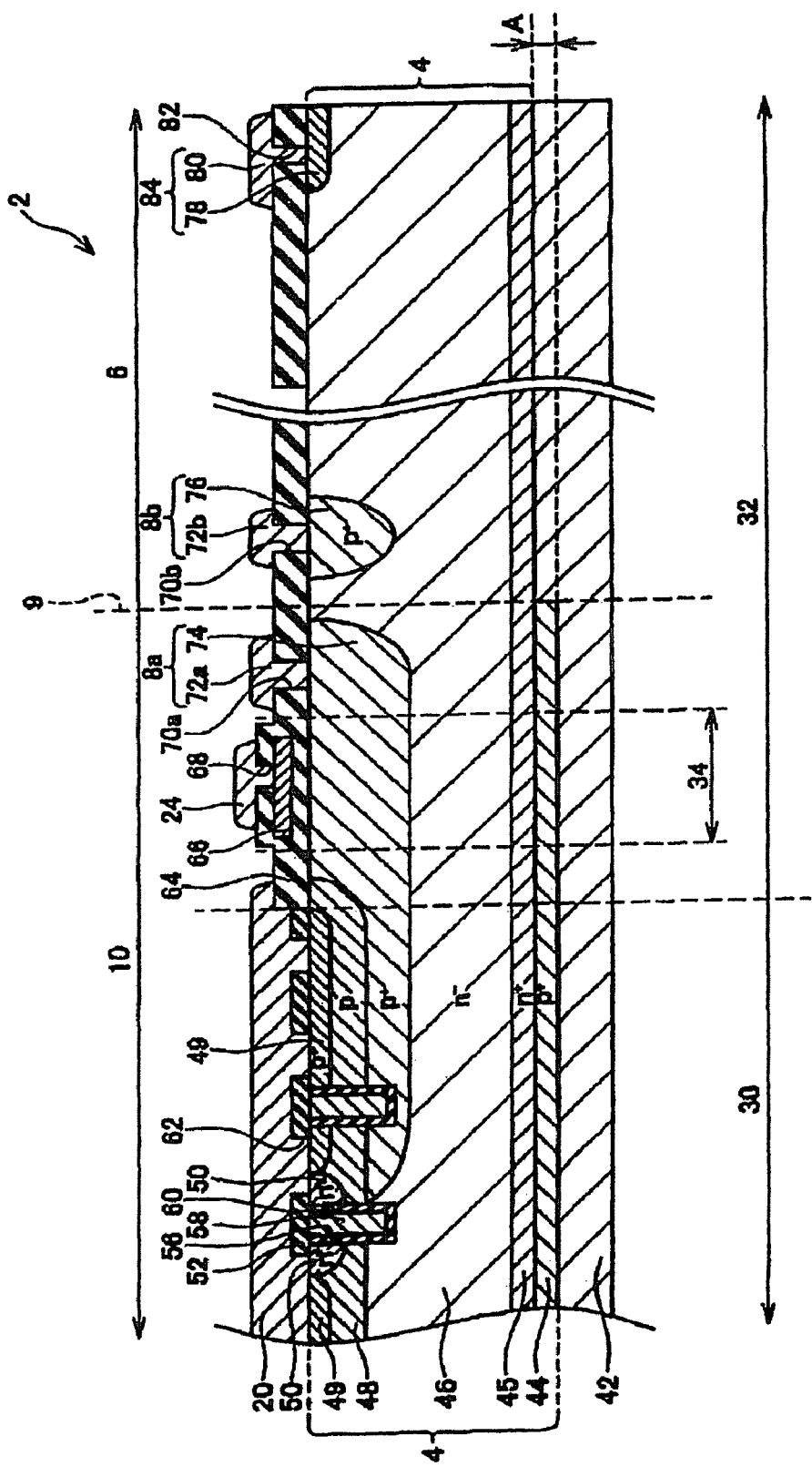
FIG. 2 is a sectional view showing the IGBT 2 according to the first embodiment of the invention.

FIG. 2 shows a cross-section taken along the line in FIG. 1. A semiconductor structure that is necessary to cause the IGBT 2 to function as an IGBT is formed in the cell region 10 of the IGBT 2. The unprocessed semiconductor substrate 4 is formed from a silicon wafer that contains n-type dopant in a low concentration, and a drift region 46 is formed of a portion of the semiconductor substrate 4, which is left unprocessed. A body region 48 that contains p-type dopant is formed on a front face of the drift region 46. A body contact region 49 that contains p-type dopant in a high concentration is formed at a position that is adjacent to a front face of the body region 48. An emitter region 50 that contains n-type dopant in a high concentration is formed at a position that is adjacent to the front face of the body region 48 and also adjacent to the body contact region 49. The body region 48 separates the emitter region 50 from the drift region 46. A trench 56 that extends from a front face of the emitter region 50, passes through the emitter region 50 and the body region 48, and reaches the drift region 46 is formed. A bottom face and side faces of the trench 56 are covered with an insulating film 60, and the trench gate electrode 58 is fitted in the trench 56. A top face of the trench gate electrode 58 is covered with an interlayer insulating film 52. The emitter electrodes 20 are formed on the front face of the IGBT 2 at a portion in the cell region 10. The emitter electrode 20 is in conductivity with the emitter region 50 through a contact hole 62 formed in the interlayer insulating film 52. The emitter electrode 20 is also in conductivity with the body region 48 through the contact hole 62 and the body contact region 49. The interlayer insulating film 52 insulates the emitter electrode 20 from the trench gate electrode 58.

An insulating film 64 is formed on a front face of the IGBT 2 at a portion that includes part of the cell region 10 and the peripheral withstand voltage region 6. In the IGBT 2 according to the first embodiment of the invention, a range where the insulating film 64 is formed is referred to as an ineffective region 32 and a range where the insulating film 64 is not formed is referred to as an effective region 30. The ineffective region 32 is wider than the peripheral withstand voltage region 6. In the ineffective region 32, the emitter electrodes 20 are not in contact with the semiconductor substrate 4. In the effective region 30, the emitter electrodes 20 are in contact with the front face of the semiconductor substrate 4. The wire 24, which connects one of the small signal pads, namely, the gate electrode pad, and the trench gate electrode 58 to each other, is formed outside the effective region 30. A region where the wire 24 is formed is referred to as a wire formation range 34. The emitter electrodes 20 are not formed in the wire formation range 34. In the wire formation range 34, the wire 24 and an internal wire 66 are connected to each other due to presence of a contact hole 68. The internal wire 66 is in conductivity with the trench gate electrode 58 on a cross-section (not shown). Further, the emitter electrodes 20 are not formed either in a range where the small signal pads 22 are formed. The wire formation range 34 and the small signal pads 22 are formed in the ineffective region 32 at a portion within the cell region 10. In the ineffective region 32 at the portion within the cell region 10, the emitter electrodes 20 are not in conductivity with the semiconductor substrate 4.

A p-type diffusion region 74 that contains p-type dopant in a high concentration and a guard ring 76 are formed in an area that is adjacent to the front face of the drift region 46 and that is in the vicinity of a boundary 9 between the cell region 10 and the peripheral withstand voltage region 6. The p-type diffusion region 74 is in conductivity with the emitter electrodes 20 through the body region 48. The guard ring 76 formed on the outer side of the p-type diffusion region 74 is insulated from the emitter electrodes 20. Conductive field plates 72a and 72b are formed on a front face of the insulating film 64 at positions in the vicinity of the boundary 9. The p-type diffusion region 74 and the field plate 72a are in conductivity with each other through a contact hole 70a formed in the insulating film 64. The innermost FLR, which is the FLR 8a, is formed of the p-type diffusion region 74 and the field plate 72a. The guard ring 76 and the field plate 72b are in conductivity with each other through a contact hole 70b formed in the insulating film 64. The outer FLR, which is the FLR 8b, is formed of the guard ring 76 and the field plate 72b. The FLR 8a and the FLR 8b have the function of preventing the withstand voltage characteristics of the IGBT 2 from deteriorating due to electric field concentration in a terminal region of the semiconductor substrate 4. The number of the FLRs insulated from the emitter electrodes 20 is determined based on the withstand voltage performance required of the IGBT 2. Only one FLR insulated from the emitter electrodes 20, which is the FLR 8b, may be formed as shown in FIG. 2, or a plurality of FLRs insulated from the emitter electrodes 20 may be formed.

A channel stopper region 78 that contains n-type dopant in a high concentration is formed at the terminal portion of the IGBT 2 at a position adjacent to the front face of the semiconductor substrate 4. The channel stopper region 78 has the function of preventing a depletion layer, which spreads when the IGBT is off, from reaching side faces of the semiconductor substrate 4. A field plate 80 is formed on the front face of the insulating film 64 at the terminal portion. The channel stopper region 78 and the field plate 80 are in conductivity with each other through a contact hole 82 formed in the insulating film 64. An EQR 84 is formed of the channel stopper region 78 and the field plate 80.

A buffer layer 45 that contains n-type dopant in a high concentration is formed on a rear face of the drift region 46. A collector region 44 that contains p-type dopant in a high concentration is formed on a rear face of the buffer layer 45. A collector electrode 42 is formed on a rear face of the IGBT 2. In the IGBT 2 according to the first embodiment of the invention, the collector region 44 is formed only in the cell region 10. Thus, the collector electrode 42 is in contact with the p-type collector region 44 in the cell region 10, and in contact with the n-type buffer layer 45 in the peripheral withstand voltage region 6. In the first embodiment of the invention shown in FIG. 2, the collector region 44 is not formed in a range where the FLR 8b, which is insulated from the emitter electrodes 20, is formed. In the range where the FLR 8b, which is insulated from the emitter electrodes 20, is formed, the collector electrode 42 is in direct contact with the buffer layer 45.

Figure 9:
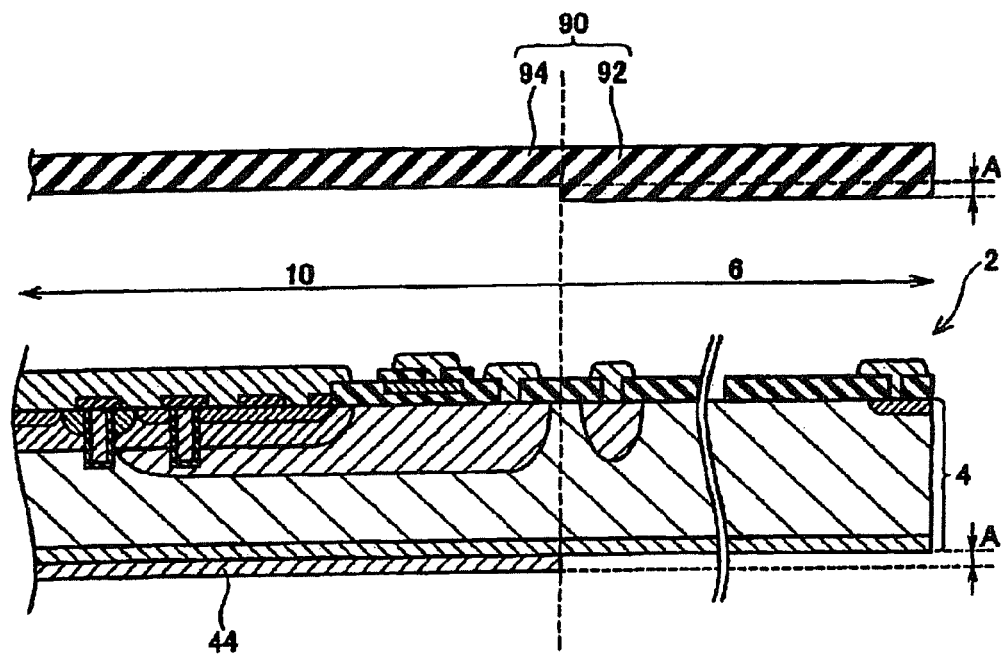
FIG. 9 is a view showing a process of producing the IGBT 2.
Figure 10:
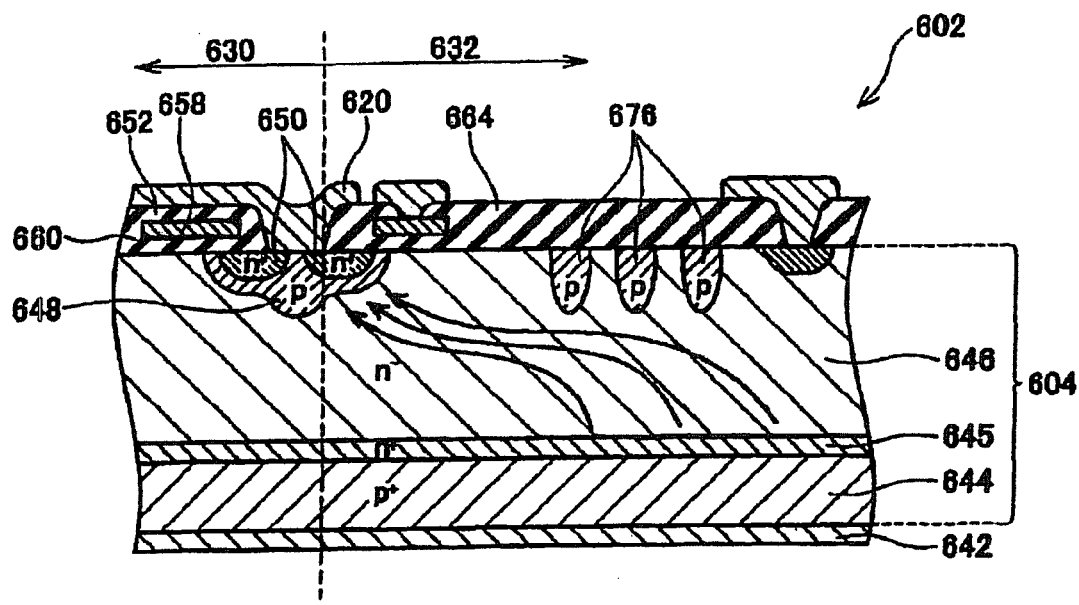
FIG. 10 is a sectional view showing an IGBT 602 described in Japanese Patent Application Publication No. 2005-142288 (JP-A-2005-142288)

As shown in FIG. 2, the semiconductor substrate 4 according to the first embodiment of the invention is thick in a range where the collector region 44 is formed, and is thin in a range where the collector region 44 is not formed. A step A is formed on the rear face of the semiconductor substrate 4. A method of forming the step A on the rear face of the semiconductor substrate 4 will be described with reference to FIG. 9. In a process of producing the IGBT 2, a tape 90 is stuck on the front face of the semiconductor substrate 4 after formation of a front face structure. The tape 90 includes a large thickness portion 92 that has a large thickness and a small thickness portion 94 that has a thickness smaller than that of the large thickness portion 92 by a thickness difference A. The tape 90 is arranged in such a manner that the large thickness portion 92 is stuck on the front face of the semiconductor substrate 4 at a portion in the range where the collector region 44 of the IGBT 2 is not formed (corresponding to the peripheral withstand voltage region 6 in the first embodiment of the invention) and the small thickness portion 94 is stuck on the front face of the semiconductor substrate 4 at a portion in the range where the collector region 44 of the IGBT 2 is formed (corresponding to the cell region 10 in the first embodiment of the invention). Thus, after the tape 90 is stuck on the front face of the semiconductor substrate 4, the front face of the tape 90 is higher at a portion in the peripheral withstand voltage region 6 of the IGBT 2 than at a portion in the cell region 10 of the IGBT 2 by the thickness difference A. In this producing method, the rear face of the semiconductor substrate 4 is polished after the tape 90 is stuck on the front face of the semiconductor substrate 4. In this case, the rear face of the semiconductor substrate 4 is polished under the condition that the semiconductor substrate 4 is bent in such a manner that the front face of the tape 90 becomes substantially flat. Thus, the semiconductor substrate 4 at a portion in the peripheral withstand voltage region 6, on which the large thickness portion 92 of the tape 90 is stuck, is distorted on the rear face side by a larger amount than the semiconductor substrate 4 at a portion in the cell, region 10, on which the small thickness portion 94 of the tape 90 is stuck. When the bent semiconductor substrate 4 is polished in such a manner that the rear face thereof becomes flat, the semiconductor substrate 4 is polished by a larger amount at a portion in the peripheral withstand voltage region 6 than at a portion in the cell region 10. When application of an external force to the semiconductor substrate 4 is cancelled after polishing the rear face thereof, the semiconductor, substrate 4 returns to its natural shape. That is, the front face of the semiconductor substrate 4 becomes flat again. As a result, the step A having a depth that is equal to the thickness difference A is formed on the rear face of the semiconductor substrate 4 at the boundary between the peripheral withstand voltage region 6 and the cell region 10. In the first embodiment of the invention, after the rear face of the semiconductor substrate 4 is polished, the rear face of the semiconductor substrate 4 is doped with p-type dopant, at a portion in the range where the collector region 44 is to be formed. Thus, the cell region 10, which is located on the inner side of the step A, is doped with the p-type dopant, and the collector region 44 is thereby formed.

When the IGBT 2 according to the first embodiment of the invention is used, the collector electrode 42 is connected to a positive electrode of a direct-current power supply, and the emitter electrodes 20 are grounded. In the cell region 10 of the IGBT 2, the collector region 44 that contains p-type dopant is in contact with the collector electrode 42, and electron holes are introduced from the collector electrode 42 into the drift region 46 through the collector region 44. In contrast, in the peripheral withstand voltage region 6 of the IGBT 2, the buffer layer 45 that contains n-type dopant is in contact with the collector electrode 42. Therefore, in the peripheral withstand voltage region 6, no electron hole is introduced from the collector electrode 42 into the drift region 46.

In a power semiconductor such as an IGBT, a voltage that is applied between the collector electrode 42 and the emitter electrodes 20 is high, and the peripheral withstand voltage region 6 is formed over a wide range in order to improve the withstand voltage characteristics of an element of the semiconductor. When electron holes are introduced from the collector electrode 42 into the drift region 46 within the wide peripheral withstand voltage region 6, the introduced electron holes are concentrated in the P-type diffusion region 74 and the drift region 46 at a portion near the guard ring 76 while flowing toward the emitter electrodes 20. In particular, in a planar view of the semiconductor substrate 4, the electron holes tend to be concentrated in a corner portion where the boundary 9 is curved. If the electron holes are concentrated in the semiconductor substrate 4, a locally high electric field E is generated due to the electron holes that are thus concentrated, and the IGBT is susceptible to latch-up. In the case where, for example, a surge voltage is applied to this IGBT, the IGBT is easily latched up. In contrast, in the IGBT 2 according to the first embodiment of the invention, no electron hole is introduced into the drift region 46 at a portion in the peripheral withstand voltage region 6. Thus, there is no location in the semiconductor substrate 4, where electron holes are concentrated. No locally high electric field is generated. Therefore, electric field concentration is alleviated, and good electric characteristics are imparted to the IGBT 2.

Figure 11:
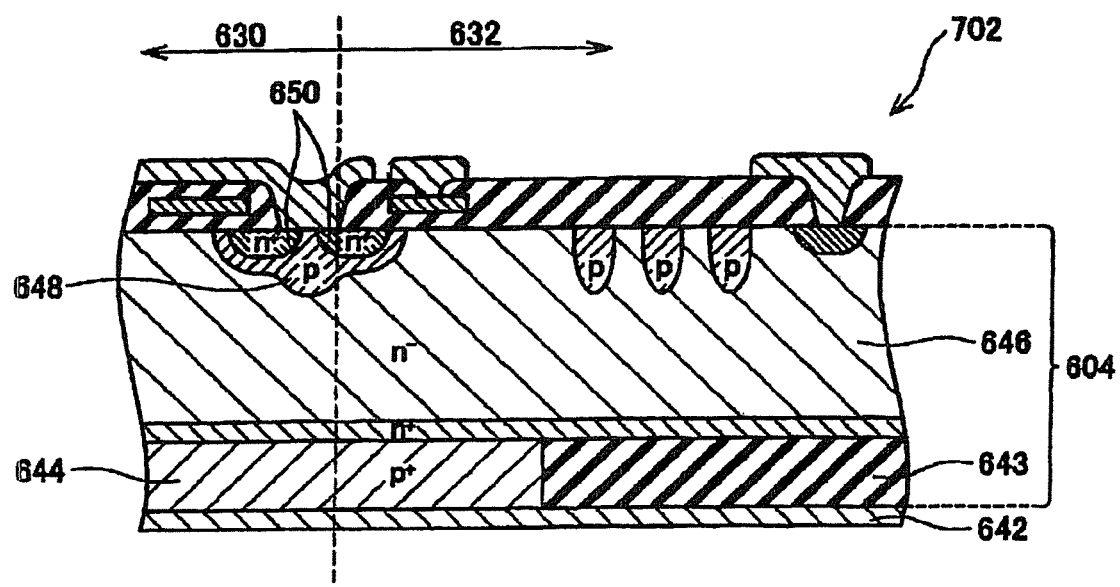
FIG. 11 is a sectional view showing an IGBT 702 described in Japanese Patent Application Publication No. 2005-142288 (JP-A-2005-142288).

In the IGBT 2 according to the first embodiment of the invention, no electron hole is introduced into the drift region 46 at a portion in the peripheral withstand voltage region 6, and, at the same time, the heat transfer performance in the peripheral withstand voltage region 6 does not deteriorate. In the IGBT 2 according to the first embodiment of the invention, a layer that hinders transfer of heat, for example, the insulating layer 643 described with reference to FIG. 11, is not formed between the semiconductor substrate 4 and the collector electrode 42 within the peripheral withstand voltage region 6. Thus, the heat generated inside the semiconductor substrate 4 is not concentrated in the cell region 10. The heat dissipation properties of the IGBT 2 are maintained at a sufficient level, and good temperature characteristics are imparted to the IGBT 2. Further, a layer that hinders the flow of electrons introduced from the emitter electrodes 20 into the drift region 46 is not interposed between the drift region 46 and the collector electrode 42 within the peripheral withstand voltage region 6. The electrons introduced from the emitter electrodes 20 into the drill region 46 are not locally concentrated while flowing toward the collector electrode 42. Local heat generation resulting from an electron current is suppressed as well.

Figure 3:
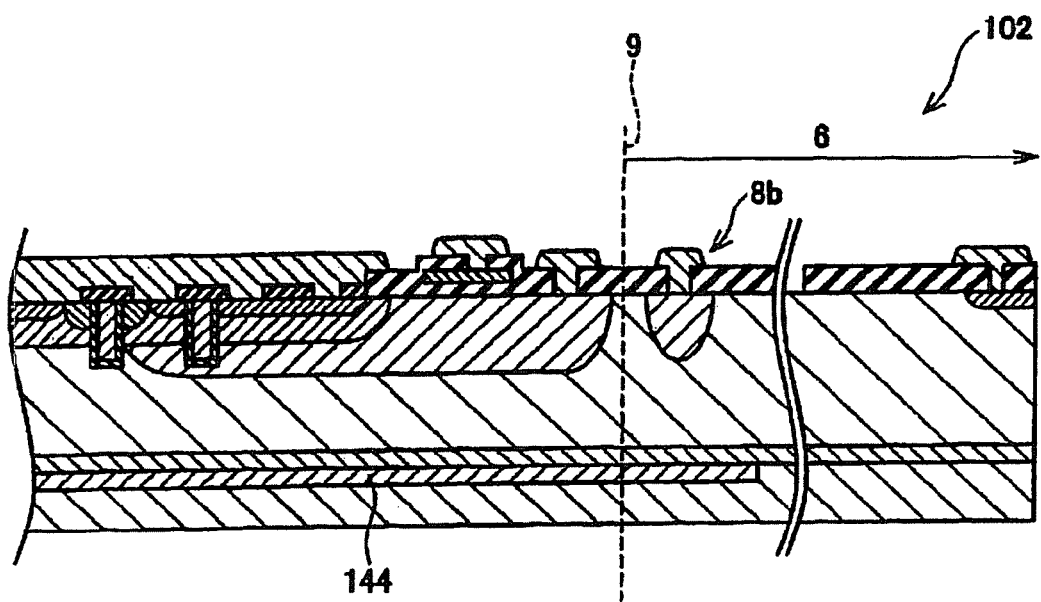
FIG. 3 is a sectional view showing an IGBT 102.
Figure 4:
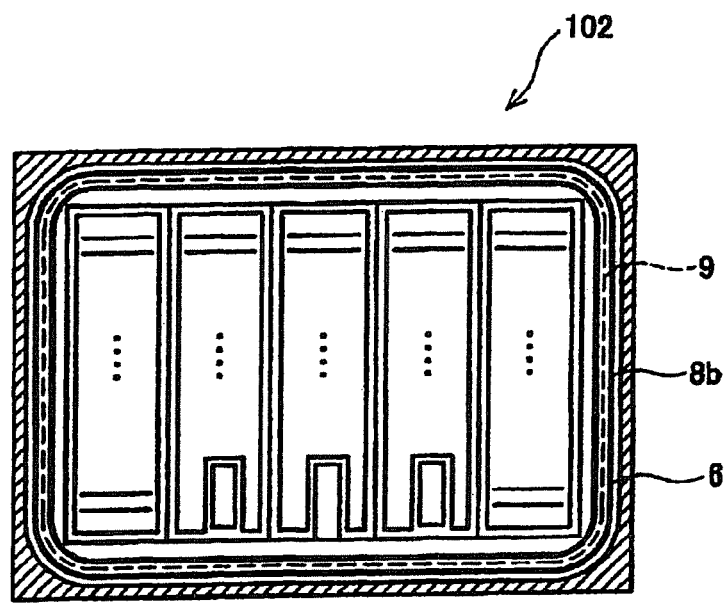
FIG. 4 is a plane view showing the IGBT 102.
Figure 5:
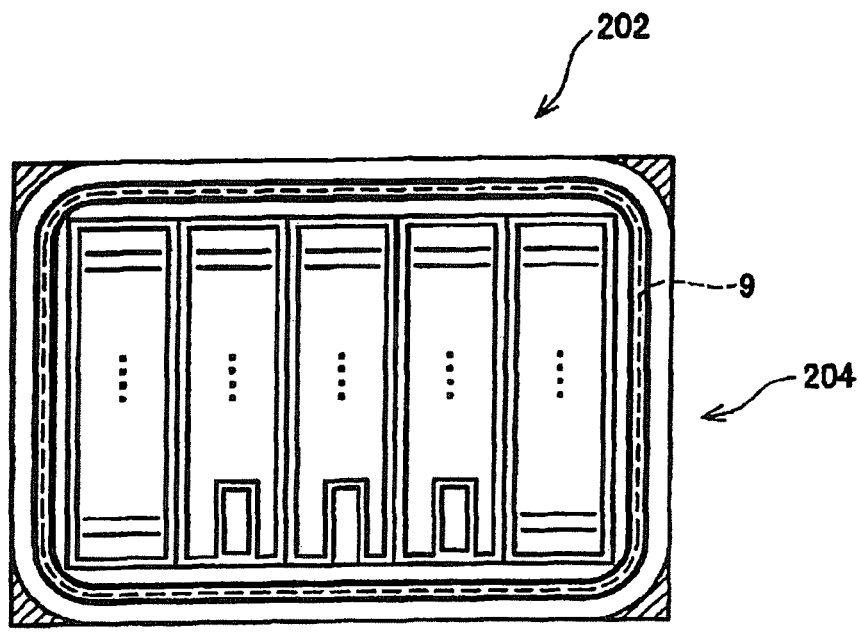
FIG. 5 is a plane view showing an IGBT 202.

In the first embodiment of the invention, the collector region 44 of the IGBT 2 is formed in the cell region 10, but the range where the collector region 44 is formed is not limited to the cell region 10. Although it is preferable to form the collector region 44 at least in the entire effective region 30, it is not necessary to omit the collector region 44 from the entire ineffective region. For example, in the case shown in FIG. 2, the collector region 44 is formed in the wire formation range 34 and the range where the innermost FLR, which is the FLR 8a, is formed, even these ranges are in the ineffective region 32. Instead of this arrangement, formation of the collector region 44 may be omitted in the wire formation range 34 and the range where the innermost FLR, which is the FLR 8a, is formed. Alternatively, as shown in a modification of the first embodiment of the invention in FIG. 3, a collector region 144 may extend to a spot directly below the FLR 8b. The effects of the invention may be produced unless the collector region 144 is formed in a range on the outer side of the FLR 8b. FIG. 4 is a plane view showing an IGBT 102 in which the collector region 144 extends to the spot directly below the FLR 8b. In FIG. 4, for the sake of better understanding, the range where the collector region 144 is not formed is expressed as a hatched region. FIG. 5 is a plane view showing an IGBT 202 according to another modification of the first embodiment of the invention. In this modification, only each corner portion of a semiconductor substrate 204 has a range where no collector region is formed. Because electron holes tend to be concentrated in the corner portions, the effects of the invention are produced if each corner portion has a range where no collector region is formed.

Figure 6:
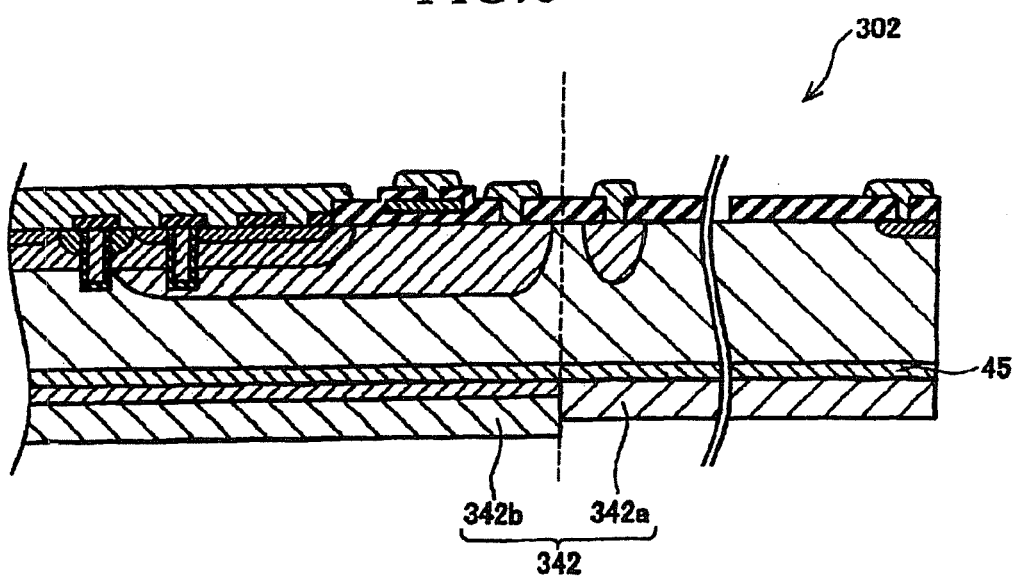
FIG. 6 is a sectional view showing an IGBT 302 according to a second embodiment of the invention.
Figure 7:
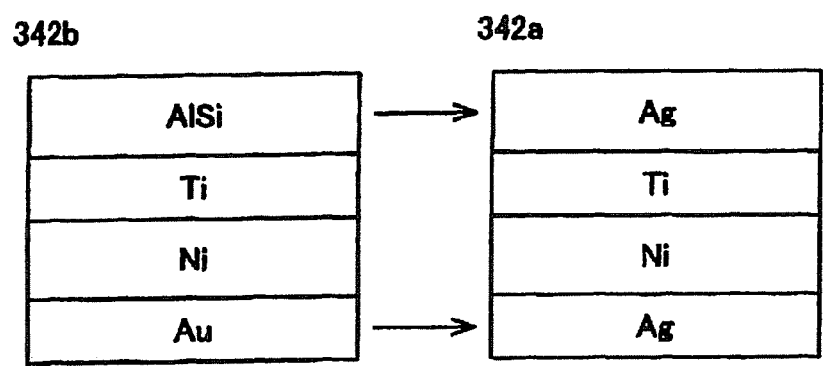
FIG. 7 is a view showing laminated structures of collector electrodes of the IGBT 302.

Hereafter, a second embodiment of the invention will be described. FIG. 6 shows an IGBT 302 according to the second embodiment of the invention. In the IGBT 302, a collector electrode 342 includes a first collector electrode 342b that is in contact with a p-type collector region, and a second collector electrode 342a that is in contact with the n-type buffer layer 45. FIG. 7 shows a laminated structure of the first collector electrode 342a and a laminated structure of the second collector electrode 342a. The first collector electrode 342b and the second collector electrode 342a are each formed by laminating four different layers. In the first collector electrode 342b, a first layer containing an aluminum-silicon alloy, a second layer containing titanium, a third layer containing nickel, and a fourth layer containing gold are laminated in this order from the layer that is in contact with the semiconductor substrate 4. In the second collector electrode 342a, a first layer containing silver, a second layer containing titanium, a third layer containing nickel, and a fourth layer containing silver are laminated in this order from the layer that is in contact with the semiconductor substrate 4. Silver exhibits lower thermal resistivity than that of the aluminum-silicon alloy. Therefore, the second collector electrode 342a exhibits lower thermal resistivity than that of the first collector electrode 342b. In the second embodiment of the invention, the first collector electrode 342b and the second collector electrode 342a have the relationship described above. As a result, the amount of heat dissipated in a range where the second collector electrode 342a is formed is increased, and good temperature characteristics are imparted to the IGBT 302.

The laminated structures of the first collector electrode 342b and the second collector electrode 342a are not limited to those shown in FIG. 7. As long as the second collector electrode 342a exhibits lower thermal resistivity than that of the first collector electrode 342b, the materials and thicknesses of the first collector electrode 342b and the second collector electrode 342a and the number of laminated layers thereof are not limited. For example, the first collector electrode 342b and the second collector electrode 342a may each be formed of a single layer. The number of laminated layers of the first collector electrode 342b and the number of laminated layers of the second collector electrode 342a need not be equal to each other. It is not important which one of the first collector electrode 342b and the second collector electrode 342a is thicker than the other. Further, as long as the entire second collector electrode 342a exhibits lower thermal resistivity than that of the entire first collector electrode 342b, the first layer, which is in contact with the semiconductor substrate 4, may exhibit low thermal resistivity at a portion that contacts the collector region, and high thermal resistivity at a portion that does not contact the collector region.

Figure 8:
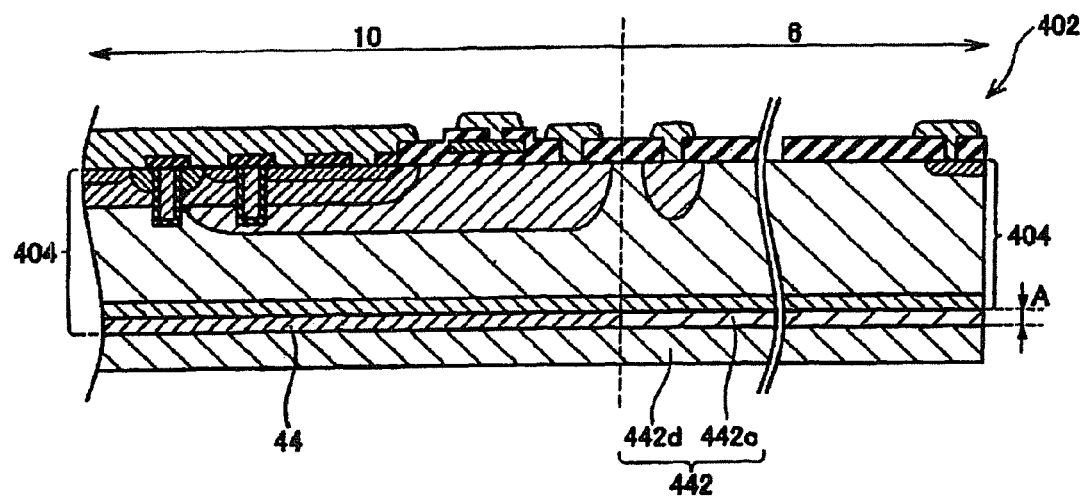
FIG. 8 is a sectional view showing an IGBT 402 according to a third embodiment of the invention.

Hereafter, a third embodiment of the invention will be described. FIG. 8 shows an IGBT 402 according to the third embodiment of the invention. On a semiconductor substrate 404, as is the case with the IGBT 2 according to the first embodiment of the invention, the step A is formed at the boundary between the cell region 10 and the peripheral withstand voltage region 6. In the IGBT 402, a collector electrode 442 includes an upper collector electrode 442c and a lower collector electrode 442d. The upper collector electrode 442c is formed in the thickness A on the rear face of the semiconductor substrate 404 at a portion in the peripheral withstand voltage region 6, whereby the level difference corresponding to the depth of the step A is eliminated. Further, the lower collector electrode 442d is formed in a uniform thickness on the rear face of the semiconductor substrate 404 at a portion in the region that includes the cell region 10 and the peripheral withstand voltage region 6. In the third embodiment of the invention, a material that exhibits lower thermal resistivity than that of the lower collector electrode 442d is used to form the upper collector electrode 442c. Therefore, within a range that includes the semiconductor substrate 404 and the collector electrode 442, the thermal resistivity in the range where the collector region 44 is not formed is lower than that in the range where the collector region 44 is formed. In the third embodiment of the invention, owing to the aforementioned relationship, the amount of heat dissipated is increased in the range where the collector region 44 is not formed, and good temperature characteristics are imparted to the IGBT 402. FIG. 8 shows the case where the depth of the step A formed on the rear face of the semiconductor substrate 404 and the thickness of the collector region 44 are equal to each other. However, the thickness of the collector region 44 is not limited to that of the structure shown in FIG. 8.

When the semiconductor substrate 404 is reduced in thickness, it is preferable to reduce the thickness of the semiconductor substrate 404 on the condition that the depletion layer formed in the semiconductor substrate 404 does not reach the collector electrode 442. If the semiconductor substrate 404 is reduced in thickness on this condition, it is possible to improve the temperature characteristics while ensuring sufficient withstand voltage of the IGBT 402. When a buffer layer is formed between a narrowly-defined drift region and a collector region. In this case, it is preferable to leave the buffer layer in such a thickness that the highest dopant concentration is obtained when the profile of the dopant concentration in the buffer layer is observed. That is, in the case where the rear face is polished to reduce the thickness of the buffer layer, it is preferable to terminate the reduction of the thickness before thickness of the buffer layer becomes equal to the thickness at which the highest dopant concentration is obtained. As a result, it is possible to improve temperature characteristics while ensuring the withstand voltage of the IGBT.

The example embodiments of the invention have been described above. However, these example embodiments are nothing but exemplifications and do not limit the scopes of the claims of the invention. The art described in the claims includes various modifications and changes of the example embodiments described above. For example, in the invention, the buffer layer 45 need not be formed. When the buffer layer 45 is not formed, the drift region 46 and the collector electrode 42 are in contact with each other in the IGBT 2 at a portion in the range in which the collector region 44 is not formed. The drift region 46 and the collector region 44 are different from each other in conductivity type. Therefore, introduction of electric charges from the range where the collector region 44 is not formed is suppressed. In the case where the narrowly-defined drift region and the buffer layer coexist, the drift region as mentioned in the invention means the narrowly-defined drift region and the buffer layer collectively.

The shape of the tape 90 that is used to produce the IGBT 2 is not limited to a particular shape. The tape 90 may take any shape as long as the thickness difference. A lies between the large thickness portion 92 and the small thickness portion 94. For example, the tape 90 may be formed in such a manner that there is no level difference between the large thickness portion 92 and the small thickness portion 94 at the rear face that contacts the semiconductor substrate 4 and there is the level difference A between the large thickness portion 92 and the small thickness portion 94 at the front face. Alternatively, the tape 90 may be formed in such a manner that there is a level difference of A/2 between the large thickness portion 92 and the small thickness portion 94 at each of both the front face and the rear face.

The technical elements described in this specification or the drawings exert their technical utility either alone or in various combinations, and the invention is not limited to the combinations described in the claims at the time of application. Further, the art exemplified in this specification or the drawings achieves a plurality of objects simultaneously, and has its technical utility by achieving one of these objects.

The invention claimed is:

1. A vertical insulated gate bipolar transistor, comprising:
    a semiconductor substrate in which at least an emitter region, a body region, a drift region, and a collector region are formed;
    an emitter electrode that is formed on a front face of the semiconductor substrate; and
    a collector electrode that is formed on a rear face of the semiconductor substrate, wherein
    the emitter region is of a first conductivity type, is formed in a range adjacent to the front face of the semiconductor substrate, and is in contact with the emitter electrode,
    the collector region is of a second conductivity type, is formed in a range adjacent to the rear face of the semiconductor substrate, and is in contact with the collector electrode,
    the drift region is of the first conductivity type, and is in contact with the collector region,
    the body region is of the second conductivity type, and separates the emitter region and the drift region from each other, the collector region is not formed in at least a portion of an ineffective region that surrounds an effective region where the front face of the semiconductor substrate and the emitter electrode are in contact with each other in a planar view of the semiconductor substrate, and the drift region and the collector electrode are in direct contact with each other in the ineffective region at the portion in which the collector region is not formed, the collector electrode includes a first portion that is in contact with the collector region and a second portion that is in contact with the drift region, and thermal resistance of the second portion is lower than thermal resistance of the first portion.

2. The insulated gate bipolar transistor according to claim 1, wherein a field limiting ring that is not in conductivity with the emitter electrode is formed in the ineffective region, and the collector region is not formed and the drift region and the collector electrode are in direct contact with each other in the ineffective region at a portion in a range in which the field limiting ring is formed.

3. The insulated gate bipolar transistor according to claim 1, wherein the semiconductor substrate is thick at a portion in a range in which the collector region is formed, and is thin at a portion in a range in which the collector region is not formed.

4. A method of producing the insulated gate bipolar transistor according to claim 3, comprising:

sticking a tape, which includes a large thickness portion that has a large thickness and a small thickness portion that has a thickness smaller than that of the large thickness portion, on the front face of the semiconductor substrate in such a manner that the large thickness portion is stuck on the front face of the semiconductor substrate at the portion in the range in which the collector region is not formed and the small thickness portion is stuck on the front face of the semiconductor substrate at the portion in the range in which the collector region is formed;

polishing the rear face of the semiconductor substrate with the tape stuck on the front face of the semiconductor substrate; and doping the rear face of the semiconductor substrate, which has been polished, at the portion in the range in which the collector region is formed with second conductivity type dopant, wherein the rear face of the semiconductor substrate is polished in a state in which the semiconductor substrate is bent in such a manner that a front face of the tape is substantially flat.

* * * * *